United States Patent [19]
Weinberg

[11] Patent Number: 5,670,824
[45] Date of Patent: Sep. 23, 1997

[54] VERTICALLY INTEGRATED COMPONENT ASSEMBLY INCORPORATING ACTIVE AND PASSIVE COMPONENTS

[75] Inventor: Alvin H. Weinberg, Moorpark, Calif.

[73] Assignee: Pacsetter, Inc., Sylmar, Calif.

[21] Appl. No.: 363,426

[22] Filed: Dec. 22, 1994

[51] Int. Cl.⁶ .................... H01L 23/34; H05K 1/16
[52] U.S. Cl. .................... 257/723; 257/724; 361/766
[58] Field of Search .................... 257/723, 724, 257/691, 774, 734, 904, 924; 361/792, 766, 778, 783, 738; 174/260, 262

[56] References Cited

U.S. PATENT DOCUMENTS

| | | | |
|---|---|---|---|
| 3,302,067 | 1/1967 | Jackson et al. | 317/101 |
| 3,564,358 | 2/1971 | Hahnlein | 317/235 |
| 3,613,226 | 10/1971 | Haisty et al. | 29/577 |
| 3,748,548 | 7/1973 | Haisty et al. | 317/235 R |
| 3,880,493 | 4/1975 | Lockhart, Jr. | 339/147 R |
| 4,117,588 | 10/1978 | Johnson | 29/608 |
| 4,499,655 | 2/1985 | Anthony | 29/576 J |
| 4,612,083 | 9/1986 | Yasumoto et al. | 257/750 |
| 4,652,065 | 3/1987 | Cassinelli | 339/17 CF |
| 4,660,066 | 4/1987 | Reid | 357/30 |
| 4,737,470 | 4/1988 | Bean | 437/38 |
| 4,761,681 | 8/1988 | Reid | 357/68 |
| 4,797,723 | 1/1989 | Nishimura et al. | 357/40 |
| 4,803,595 | 2/1989 | Kraus et al. | 361/412 |
| 4,884,237 | 11/1989 | Mueller et al. | 365/63 |
| 4,902,637 | 2/1990 | Kondou et al. | 437/51 |
| 4,954,458 | 9/1990 | Reid | 437/51 |

FOREIGN PATENT DOCUMENTS

272945A1  10/1989  Germany.

*Primary Examiner*—Mahshid D. Saadat
*Assistant Examiner*—Jhihan B. Clark

[57] ABSTRACT

An vertically-integrated electronic assembly containing integral passive components is combined with an integrated circuit creating a three-dimensional package. The electronic assembly is formed as a multi-layered structure having deposited passive components on a substrate layer. Contact pads for the passive components extend to an edge of the substrate layer and are exposed for contact with surrounding circuitry and with the combined integrated circuit.

21 Claims, 5 Drawing Sheets

VERTICALLY INTEGRATED COMPONENT ASSEMBLY INCORPORATING ACTIVE AND PASSIVE COMPONENTS

FIELD OF THE INVENTION

This invention relates generally to three-dimensional micro-electronic semiconductor circuit structures. More particularly, this invention relates to methods and apparatus for vertically integrating, or stacking, passive components with an associated integrated circuit to form an integrated package.

BACKGROUND OF THE INVENTION

For a given electrical apparatus, electronic components such as integrated circuits and associated analog circuitry are typically situated and interconnected on a main substrate board. On the main substrate board, the individual components are interconnected through conducting pathways also situated on the main substrate. Such substrate boards are used to form various circuitry for countless electronic applications. In many of these applications, it is important that the size of the main substrate board be as small as possible. One factor requiring reductions in the size of the board is the physical dimension of an associated product which makes use of the board. Accordingly, it becomes crucial to configure and package the components so that the surface area of the substrate board is optimized.

Digital electronic circuits which are configured on a substrate board will sometimes incorporate many analog circuit components. These analog circuit components, which are often passive, may be used as part of a hybrid circuit, or for applications such as filtering of power supply voltage. Such passive components can occupy a significant portion of the substrate surface area, leaving less room for the placement of integrated circuits.

Several U.S. patents have addressed the problem of main substrates having a limited surface area. These patents disclose various methods of packaging components with an integrated circuit in a vertical, or three-dimensional, orientation. For example, U.S. Pat. No. 3,302,067, issued to Jackson et al., discloses a method of placing circuit modules onto a mounting board. The mounting board is constructed with interconnecting pathways between each of the modules. The modules are constructed with active electronic components on one side and with electrical resistances deposited on an opposite side. The electrical resistances communicate with the active elements by wrap-around conducting pathways which are formed around the edges of the module.

Various attempts have also been made in the prior art to integrate passive components with associated integrated circuits so that the passive components become part of the integrated circuit. This approach is used where the passive components can be designed into the integrated circuit. However, because the required passive components may be dependent on surrounding circuitry, integrating passive components within a semiconductor may not be feasible where the overall circuit structure for a given application is unknown.

Patents which disclose various methods for making three-dimensional integrated circuits formed as a semiconductor device include U.S. Pat. No. 3,564,358, issued to A. Hahnlein; U.S. Pat. No. 3,748,548, issued to Haisty et al.; U.S. Pat. No. 4,612,083, issued to Yasumoto et al.; and U.S. Pat. No. 4,902,637, issued to Kondou et al. These methods purport to minimize the physical dimensions of a semiconductor chip which is used to implement a given circuit.

Additionally, some patents address the difficulties that arise when modifications must be made to a circuit which has been designed onto a substrate. Specifically, U.S. Pat. No. 4,803,595, issued to Kraus et al., discloses a structure, called an "interposer", which is placed between an existing main substrate and a semiconductor chip. Such interposers can be specifically chosen, or modified, to accommodate engineering changes made to the wiring between chips on a main substrate. As a result, pathways between components are altered by routing them through portions of the interposer. U.S. Pat. No. 4,652,065, issued to Cassinelli, discloses a mounting socket which is disposed between a semiconductor chip and a printed circuit board. As disclosed in the '065 patent, the mounting socket can have several layers, one of which has electrical components for connecting certain pins of the socket to voltage potentials. In addition, one of the mounting socket layers may contain planar terminating resistive components.

When designing circuit structures, it is desirable to have the flexibility to add passive-component circuitry to a substrate board layout after its initial design, even where the existing substrate layout provides no excess surface area for placement of these passive components. It is also desirable to directly interconnect such passive components with the integrated circuit mounted on the substrate.

One area where the size of a main substrate board is extremely important is the field of cardiac stimulation devices, such as pacemakers or defibrillators. For obvious reasons, it is desirable to reduce the size of a cardiac stimulation device which must be implanted within a patient. To do so, the size of the associated electronic circuitry, and the main substrate which contains the electronic circuitry, must be minimized. Because substrate boards for cardiac stimulation devices have little, if any, spare surface area, adding passive components at a late stage may ordinarily be impractical and/or extremely expensive.

Integrated circuit components of cardiac stimulation devices are often attached to a main substrate layer through the use of wire bonds instead of connection pins inserted into corresponding sockets. The methods disclosed in the prior art for forming a three-dimensional integrated circuit structure are impractical for integrated circuits which do not have connection pins. Specifically, wire-bonded integrated circuits have no pins for insertion into an adapting or mounting structure. Therefore, there is a need in the art for a vertically integrated, or three-dimensional, structure combining passive components to a wire-bonded, or similarly connected, integrated circuit. This three-dimensional structure should be readily adaptable to an associated main substrate.

SUMMARY OF THE INVENTION

The apparatus and method disclosed herein recite a vertically integrated package comprising a passive component assembly bonded to an integrated circuit. The entire package may then be placed on a main substrate board for electrical connection thereto. In the preferred embodiment, a passive-component substrate is bonded on one side to a conducting ground plane. On an opposite side of the substrate, passive components, such as resistors and capacitors, are printed onto the substrate surface. The ends of the passive components are connected to electrical pathways which are also printed on the substrate surface, and which extend to a periphery of the substrate. The electrical pathways terminate at contact pads, or fingers, at or near the periphery. A dielectric material is then placed over the printed passive components and electrical pathways, without covering the contact pads. Conducting vias are formed through the dielectric material and the substrate surface. A second conducting ground plane is placed over the dielectric material. The second ground plane is electrically connected to the first ground plane through the conducting vias. This forms a vertically integrated passive component assembly. An integrated circuit may then be placed on top of the second ground plane to form a vertically integrated package combining the integrated circuit with passive components. The entire package is then placed upon a main substrate where the integrated circuit may be wire-bonded, or otherwise connected to, the substrate surface. Similarly, the passive components are in turn connected through the contact pads to the integrated circuit, and to the main substrate as desired.

BRIEF DESCRIPTION OF THE DRAWINGS

The above and other aspects, features and advantages of the present invention will be more apparent from the following particular description thereof presented in conjunction with the following drawings wherein.

DETAILED DESCRIPTION OF THE PREFERRED EMBODIMENT

Figure 1:
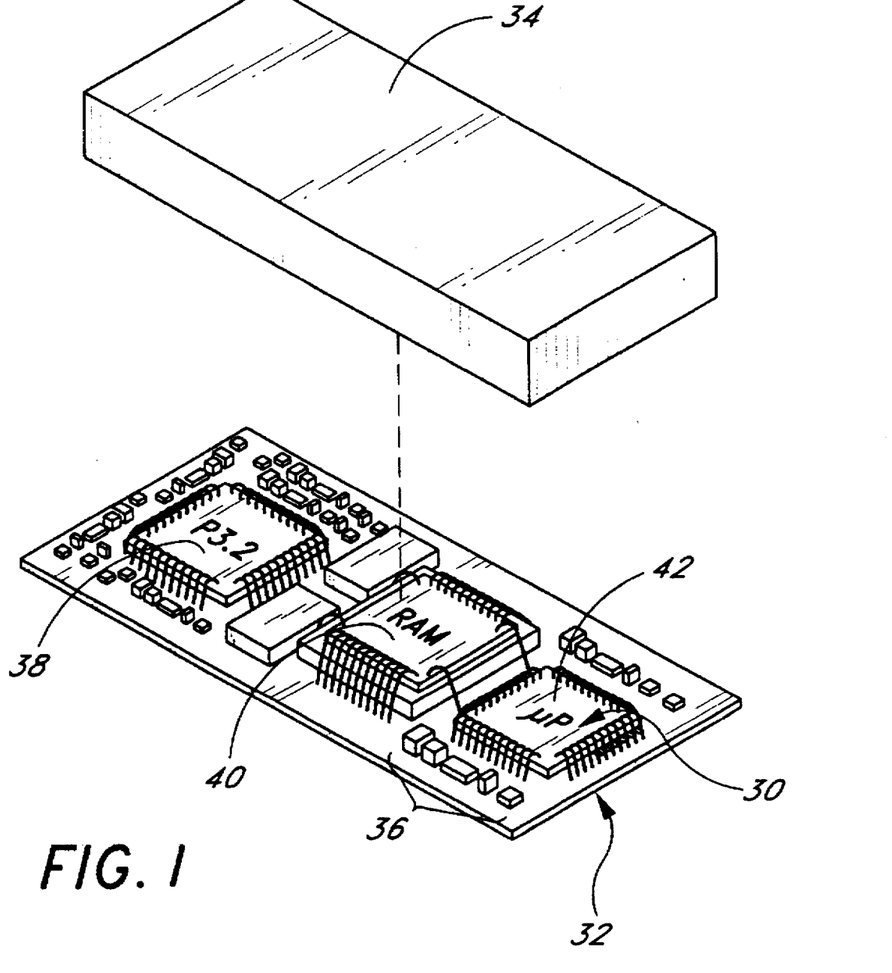
FIG. 1 is a perspective view of a preferred embodiment of an integrated passive component assembly and associated integrated circuit.

Referring initially to FIG. 1, a vertically integrated package 30 combining an integrated circuit 42 with integral passive components (not shown), is electrically connected to a main substrate board 32. The main substrate board 32 is of a type typically used for constructing microelectronic circuits to be used in cardiac stimulation devices. The particular substrate board 32 shown in FIG. 1 contains various passive components 36 and additional integrated circuits 38 and 40. A cover 34 is placed over the substrate 32 for enclosing the circuit components before the substrate 32 is used in its intended application.

The vertically integrated package 30 is a multi-layered structure having passive components positioned next to an integrated circuit in a three-dimensional fashion. Construction of the vertically integrated package 30 combining an integrated circuit with integral passive components can best be described in connection with FIGS. 2–7.

Figure 2:
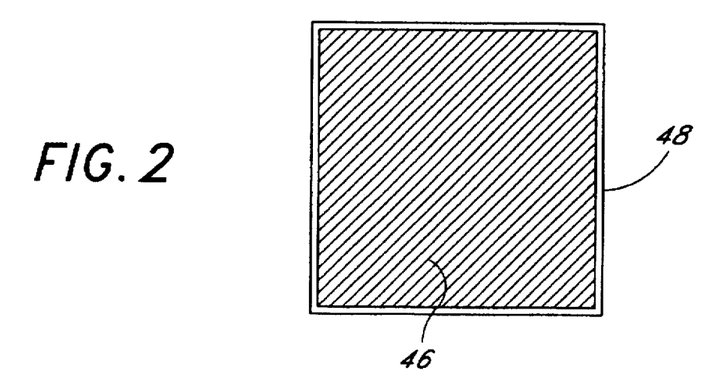
FIG. 2 is a plan view of a substrate layer in an initial stage of manufacturing a vertically integrated passive component assembly.

Referring initially to FIG. 2, a rectangular conducting plane 46 is shown mounted on one side of a substrate, 48. In a preferred embodiment, the conducting plane 46 will serve as a ground plane. The dimensions of the conducting ground plane 46 approximate those, but are slightly less than, the adjacent substrate 48.

Figure 3:
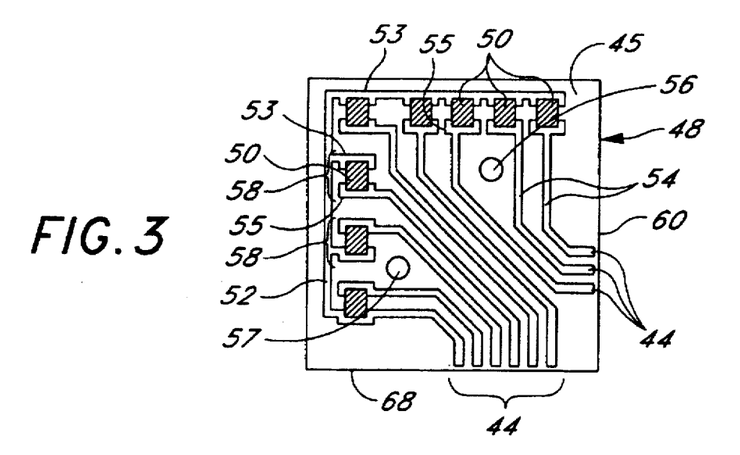
FIG. 3 is a plan view of the substrate layer of FIG. 2 in a subsequent stage of assembly of the vertically integrated passive component assembly.

Referring now to FIG. 3, a surface 45 of the substrate 48 is shown which is opposite the surface attached to the ground plane 46 (shown in FIG. 2). Several portions of electrical resistive material 50 are printed onto the surface 45 between metallic pads 53 and 55 for constructing a plurality of vertically integrated resistors 58. In the preferred embodiment, the substrate 48 is of a thick-film variety which is most suitable for the deposition of printed passive components. In addition to a thick-film substrate, a "low-temperature" co-fired ceramic substrate material is also suitable for receiving the printed resistive material 50. The resistive material 50 may be printed onto the surface 45 through conventional methods common to one of ordinary skill in the art. Specifically, the resistive material 50 may be printed on a thick-film substrate using an electronic silk-screening, or stenciling, procedure.

In addition to the resistive material 50 and pads 53, 55, conductive pathways 52 and 54, are also printed onto the substrate surface 45. These pathways 52, 54, extend to edges 60 and 68 of the substrate 48. At the edges 60 and 68, the conductive pathways 52 and 54 terminate into a series of electrical metallic pads, or fingers, 44. The electrical pads 44 allow interconnection between the passive components 58 and surrounding circuitry (not shown). Two apertures, or vias, 56 and 57 are formed in the substrate 48. These vias 56, 57 are used for interconnecting the ground plane 46 to a second ground plane, as described below.

Figure 4:
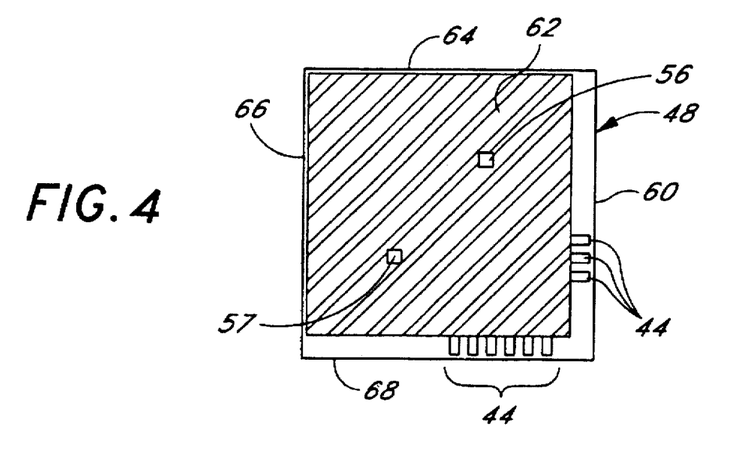
FIG. 4 is a plan view of a subsequent assembly stage of the vertically integrated passive component assembly of FIG. 3.

FIG. 4 illustrates a subsequent stage in the procedure for constructing a vertically integrated package combining an integrated circuit with a passive component assembly. As shown, a dielectric material 62 is placed over the passive components 58 and associated pathways 52, 54 of the substrate 48. The vias 56 and 57 are also extended through the dielectric material 62. In a preferred embodiment, the dielectric material 62 has a surface area which is slightly less than that of the substrate 48. The dielectric material 62 is oriented for alignment with the substrate 48 along edges 64 and 66. This particular alignment leaves a portion of the edge 60, and a portion of the edge 68, of the substrate 48 exposed. Likewise, the metallic pads 44, which terminate at the edges 60 and 68, are exposed enabling connection of the pads 44 to a main substrate board and/or an integrated circuit, such as a microprocessor (not shown).

In an alternative embodiment, the metallic pads 44 may be extended to wrap around the edges 60, 68, or whichever edge or edges the pads 44 may extend to. In this alternative configuration, the dielectric material 62 may be of a dimension substantially the same as that of the substrate 48.

Accordingly, all of the edges 60, 64, 66 and 68 would then be aligned. This latter arrangement would still allow interconnection between the metallic pads 44 (along the edges 60 and 68), and the associated main substrate and integrated circuit (not shown).

Figure 5:
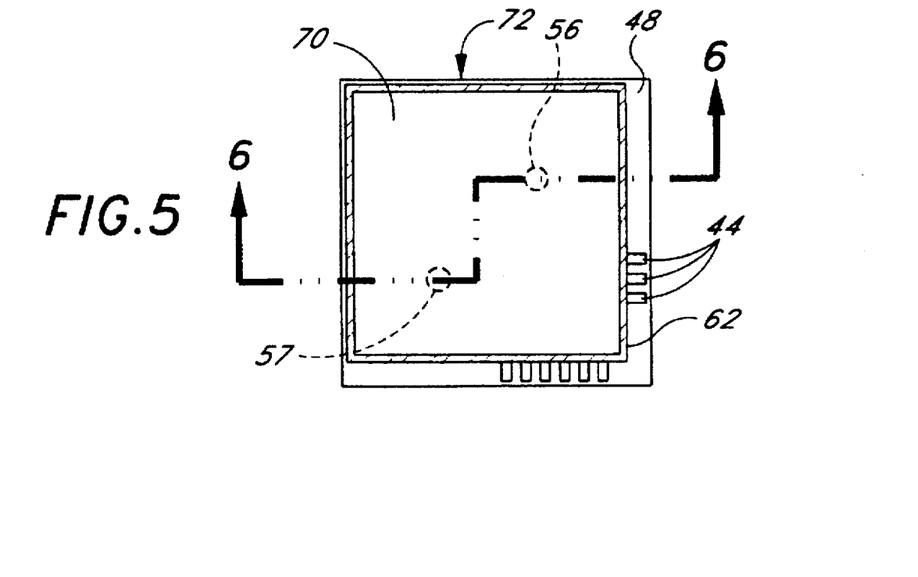
FIG. 5 is a plan view of the completed vertically integrated passive component assembly.

Referring now to FIG. 5, a second conducting plane 70 is placed over the dielectric material 62. Attachment of the ground plane 70 completes the layered structure forming an vertically integrated passive component assembly 72 which can then be attached to an integrated circuit (shown in FIG. 7). In a preferred embodiment, the ground plane 70 will be of marginally smaller dimensions than the dielectric layered 62 to minimize the possibility of the pads 44 shorting to the ground plane 70 upon connection to surrounding circuitry.

Figure 6:
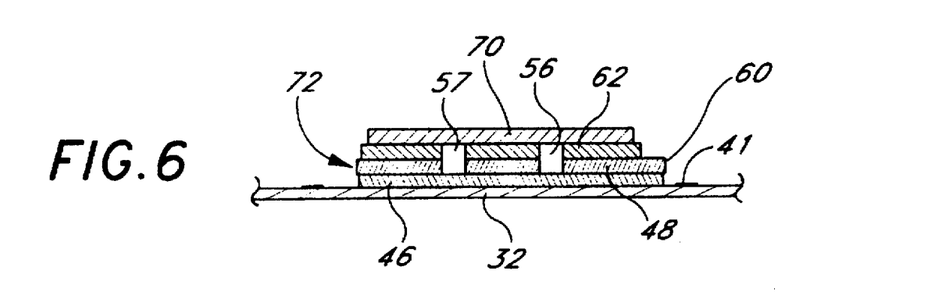
FIG. 6 is an elevation view, in cross section, taken along the line 6—6 of FIG. 5 showing the relationship between respective layers of a vertically integrated passive component assembly.

Referring now to FIG. 6, a cross-sectional view of the passive component assembly 72 can be seen as taken along the line 6—6 of FIG. 5. The passive component assembly 72 is shown placed upon the main substrate board 32. The first ground plane layer 46 is shown attached to the main substrate board 32 and to the passive-component substrate 48. The dielectric material 62 is placed on top of the substrate 48. The passive resistors (not shown) reside between the passive-component substrate 48 and the dielectric material 62. The second ground plane 70 is placed over the dielectric material 62 and the conducting vias 56, 57 are formed through the substrate material 48 and the dielectric material 62. In a preferred embodiment, the conducting vias 56 and 57 provide a passageway for interconnecting the ground planes 46 and 70. Interconnection of the ground planes 46 and 70 is typically accomplished by filling the vias 56 and 57 with gold or other suitable metallic substance.

Figure 7:
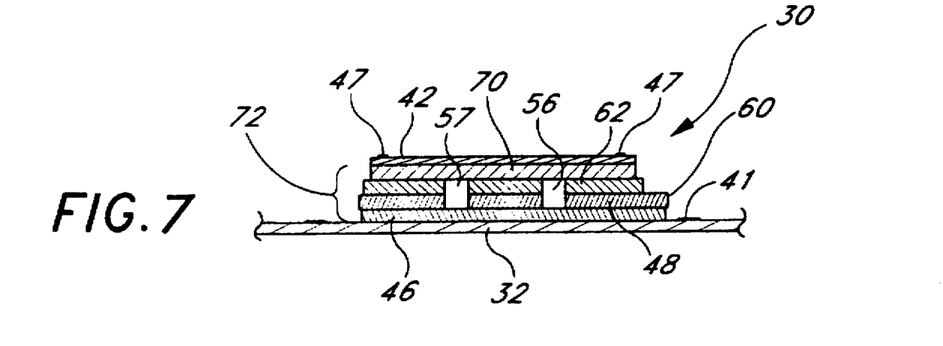
FIG. 7 is an elevation view, in cross section, showing a vertically integrated package comprising the vertically integrated passive component assembly of FIG. 6 integrally connected to an associated integrated circuit.

FIG. 7 depicts the passive component assembly 72 attached to the integrated circuit 42, or other semiconductor device, to form a vertically integrated package 30 which is mounted onto the associated main substrate board 32. The integrated circuit 42 has a series of metallic input/output contact pads 47 for transfer of data to surrounding circuitry (not shown). Before attachment of the vertically integrated package 30 to the main substrate board 32, the passive components 58 do not have to be electrically connected to the integrated circuit 42. This allows a design engineer to easily customize the interconnection of the passive component assembly 72, and the circuitry of the main substrate board 32, with the integrated circuit 42.

The specific dimensions of the different layers of the package 30 may be modified depending on the needs of a designer. In general, the dimensions of the dielectric layer 62, ground plane 70, and the integrated circuit will be nearly identical, such that their boundaries are contiguous. In a preferred embodiment, however, the dielectric layer 62, ground plane 70, and the integrated circuit 42, have overall dimensions smaller than the ground plane and substrate layers 46, 48. This allows a portion of the substrate layer 48, and the associated metallic pads 44 to remain exposed for connection with surrounding circuitry (not shown). Moreover, in a preferred embodiment, the ground planes 46 and 70 are sized to reduce the possibility of the ground planes 46, 70 shorting to a nearby contact pad. Specifically, ground plane 46 has a slightly smaller width than the substrate layer 48. Similarly, the ground plane 70 has a slightly smaller width than the dielectric material 62. Smaller-sized ground planes may or may not be necessary, however, depending on the configuration of the package 30, and depending on the type of electrical connections made between the package 30 and associated circuitry.

The integrated passive component assembly 72 may be constructed for use in a number of applications. The assembly 72 may be sold separately and later combined with a specific integrated circuit chosen by a design engineer. Alternatively, the vertically integrated package 30 combining the integrated circuit 42 with the passive component assembly 72, may be sold as a single unit. Because the resistive material of the assembly 72 is inaccessible once construction of the assembly 72 is complete, several passive component assemblies may be manufactured, each having different component-resistivity levels intended for specific purposes.

In order to further meet the needs of a design engineer, the passive-component assembly 72 can be manufactured in many dimensions, and with various types and combinations of passive components. In fact, any passive component may be realized on the substrate 48, including capacitors and inductors. For example, a capacitor may be formed on the substrate 48 by printing a dielectric material between the pads 53 and 55 (shown in FIG. 3). An inductor may be formed on the substrate 48 by printing a miniature coil on the surface 45 (shown in FIG. 3) of the substrate 48.

Figure 8:
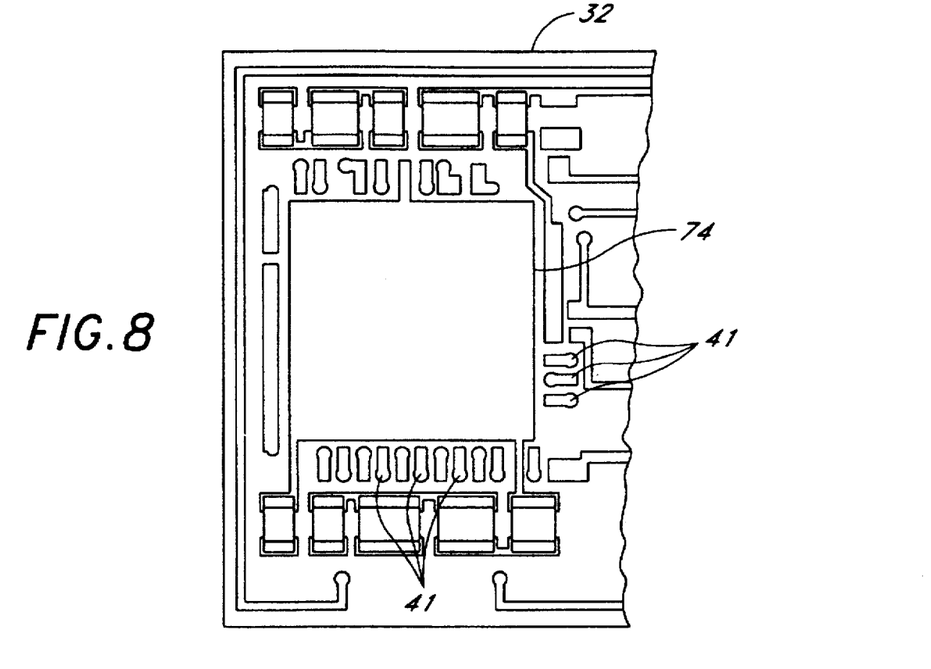
FIG. 8 is a fragmentary plan view of a main substrate board having an area defined for receipt of a vertically integrated package comprising the integrated circuit and the passive component assembly.

Referring now to FIG. 8, the main substrate board 32 is shown having a border 74 for receipt of the passive component assembly 72 (not shown) and the associated integrated circuit 42 (not shown). The substrate 32 has metallic contact pads 41 placed about the border 74 for interconnection with the input/output contact pads 47 of the integrated circuit 42 (shown in FIG. 7), and the contact pads 44 of the assembly 72 (shown in FIG. 7). The metallic pads 41 are in turn electrically connected to additional circuitry (not shown) placed on the main substrate board 32.

Figure 9:
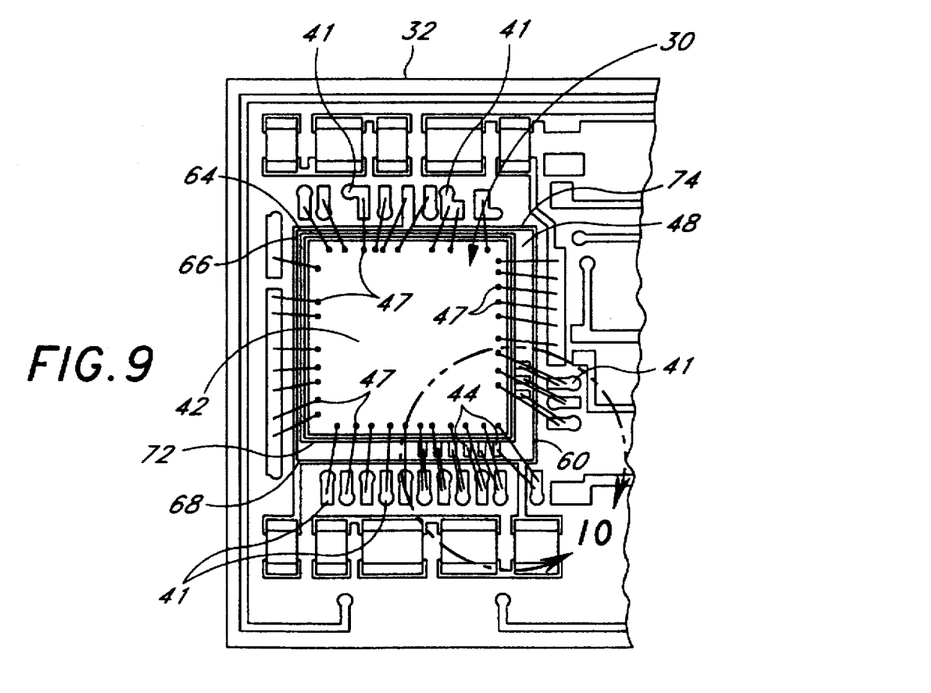
FIG. 9 depicts the vertically integrated package placed on, and electrically connected to, the main substrate board of FIG. 8.

FIG. 9 illustrates, from a top view, the completed vertically integrated package 30 combining the integrated circuit 42 with the integral passive component assembly 72, all mounted to the main substrate board 32. The contact pads 44 are juxtaposed with at least some of the contact pads 41 of the main substrate board 32, and at least some of the input/output contact pads 47 of the integrated circuit 42. In this configuration, passive components of the assembly 72 can be easily interconnected between the integrated circuit 42 and the substrate contact pads 41 without occupying the limited surface area of the substrate 32. Instead, the only area sacrificed is the vertical space which accommodates the individual layers for forming the passive components.

Although the pads 44 of FIG. 9 are shown positioned along the edges 60 and 68, it can be appreciated that the pads 44 could be extended to any combination of the four edges 60, 64, 66, and 68. The particular positioning of the pads 44 would of course depend on the ultimate application of the vertically integrated package 30. For example, if resistors were needed for connection to certain of the contacts 41 at each of the edges 60, 64, 66, and 68, then the integrated circuit 42 and associated ground plane 70 would be centered over the underlying substrate 48. Such a configuration would leave a top portion of all four edges 60, 64, 66 and 68 exposed. In an alternative embodiment, the contact pads of the passive components would be accessible if extended around the edges 60, 64, 66, 68 of the substrate 48, obviating the need to have an integrated circuit of smaller dimensions than the substrate 48.

Figure 10:
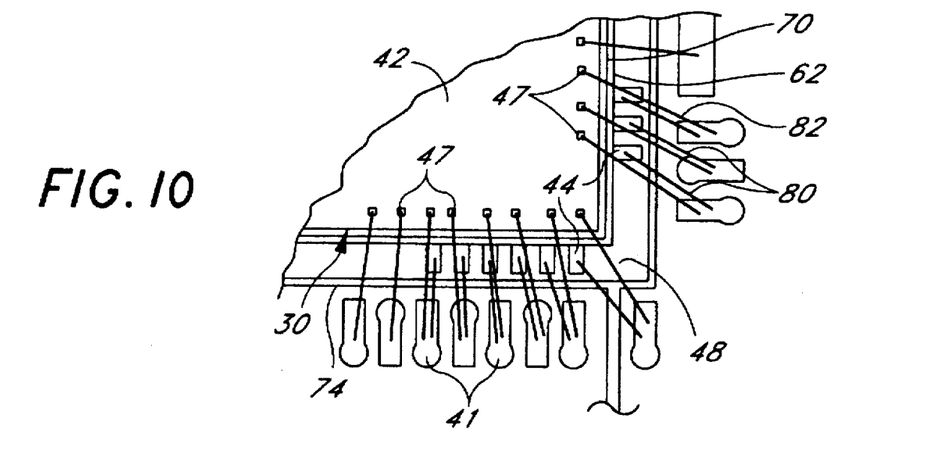
FIG. 10 is a fragmentary, enlarged, plan view depicting the package of FIG. 9 showing one implementation of the vertically integrated package.

FIG. 10 is an enlarged view of the portion of FIG. 9 within the dashed circular region. In FIG. 10, most of the layers which form the integrated three-dimensional package 30 can be seen. The first ground plane layer 46, however, cannot be seen because it rests beneath the substrate 48. The substrate layer 48 terminates near the periphery 74 and has exposed metallic contact pads 44 for electrical communication with associated passive components. Above the substrate layer 48, are the dielectric layer 62, the second ground plane 70, and finally the integrated circuit 42. After mounting the assembly 72 and integrated circuit 42 onto the substrate 32, the pads 44 may be connected to the integrated circuit 42 and the substrate 32 by wire bonds. Specifically, wire bonds 80 connect the individual contact pads 44 to corresponding contact pads 41 of the main substrate board 32. Other wire bonds 82 interconnect the main substrate contacts 41 with the integrated circuit input/output contact pads 47. Although wire bonding is used in a preferred embodiment of the present invention, any other suitable method customary in the art may be used to connect the passive components 58 (not shown) to surrounding circuitry.

As is typical in microelectronic circuits, a large portion of the surface area present on the substrate 32 is occupied by the semiconductor device 42, surrounding passive components 36, and by the metallic pads 41 and corresponding metallic pathways 43. Moreover, the overall configuration of the main substrate board 32 for a given circuit may be designed before the particular type and/or brand of integrated circuit to be used is known. In such a case it may not be possible to determine at the time of constructing the main substrate board 32, whether any supporting passive circuit components will be needed. If subsequent engineering modifications dictate such components are needed, it can be very difficult to configure the substrate to accommodate such components given the limited surface area present on the substrate.

The passive component assembly 72 disclosed herein offers a unique method of adapting passive circuitry with an existing circuit structure. By extending contacts for integrated passive components to an outside edge of an associated substrate, the passive components can be easily accessed and connected to a surrounding circuit. Although the passive component assembly 72 as disclosed herein is primarily shown in circuit structures which use a wire-bonded integrated circuit, it is also useful with other types of integrated circuits. For example, some integrated circuits are commonly referred to as "flip-chips" in the electronic industry. These flip-chips have contact pads formed as tiny hemispheres, or formed as some other type of elevated contact pad. Flip-chips are mounted on a main substrate upside-down so that the chip's contact pads attach directly to associated contact pads formed on the main substrate. To use an integrated passive component assembly with a flip-chip, the assembly would be mounted on top of the flip-chip and connected to the main substrate contact pads.

Figure 11:
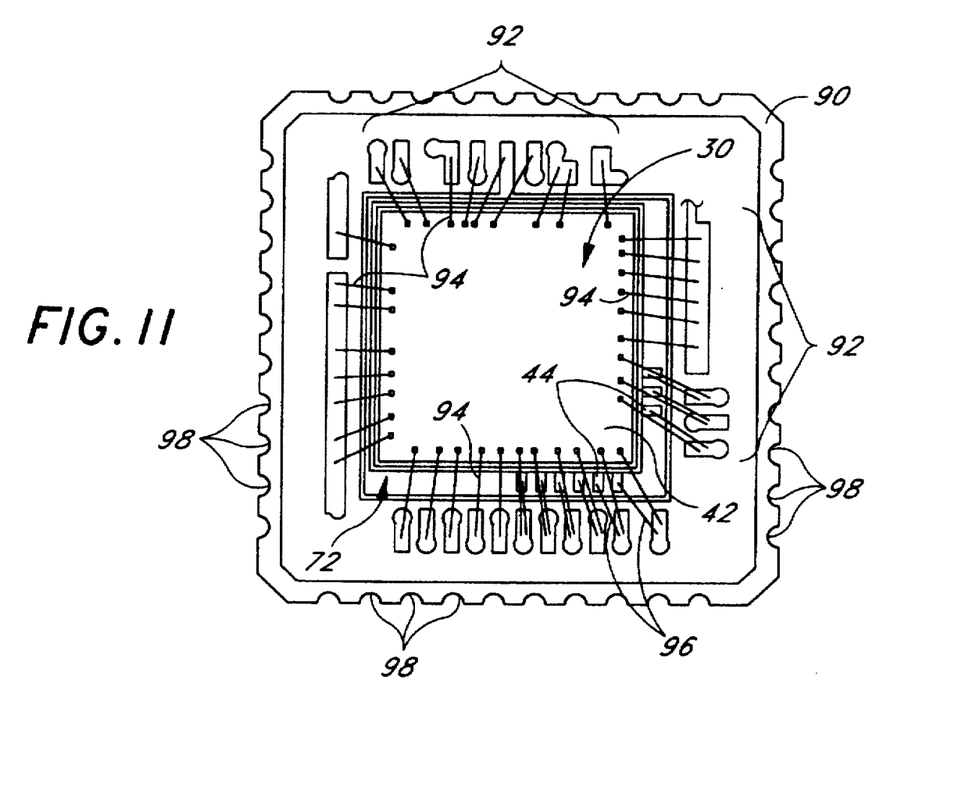
FIG. 11 is a plan view of a ceramic chip carrier configured to house the vertically integrated package.

The integrated three-dimensional package 30 is adaptable to many applications intended for use with an integrated circuit alone. For example, FIG. 11 illustrates a top view of the passive component assembly 72 and the associated integrated circuit 42, all placed within a "chip carrier" 90. The chip carrier 90 is a type commonly used in the electronic industry for providing a discrete integrated circuit package suitable for testing, or special-handling purposes. As shown in FIG. 11, the assembly 72 and the integrated circuit 42 are also wire bonded to the chip carrier 90. Specifically, wire bonds 94 and 96 connect the integrated circuit 42 and the passive component assembly 72, respectively, to metallic contact pads 92 formed on the chip carrier 90. Typically, the contact pads 92 will in turn be electrically connected to corresponding metallic grooves 98 enabling the internal integrated circuit 42 to be accessed from an external location of the chip carrier 90.

Through the foregoing description and accompanying drawings, the present invention has been shown to have important advantages over current apparatus and methods relating to three-dimensional integrated circuit structures. While the above detailed description has shown, described, and pointed out the fundamental novel features of the invention, it will be understood that various omissions and substitutions and changes in the form and details of the device and process illustrated may be made by those skilled in the art, without departing from the spirit of the invention. Therefore, the invention should be limited in its scope only by the following claims.

What is claimed:

1. An apparatus for combining an integrated circuit device with passive components comprising:

a conductive layer forming a first ground plane;

a substrate layer juxtaposed with the conductive layer, the substrate layer having contact pads and passive component material printed in a desired pattern between the contact pads so that a plurality of passive components are formed thereon, the contact pads having fingers extending substantially to an edge of the substrate layer;

a dielectric layer juxtaposed with the substrate layer for insulating the passive components; and a second conductive layer juxtaposed with the dielectric layer and forming a second ground plane, the second ground plane being electrically connected to the first ground plane and electrically insulated from the plurality of passive components, the second conductive layer providing a mounting surface for the integrated circuit device.

2. The apparatus of claim 1, wherein the first conductive layer and the second conductive layer are electrically connected through a conducting via formed within the dielectric layer and the substrate layer.

3. The apparatus of claim 1, further comprising:

an integrated circuit device electrically and mechanically mounted onto the second conductive layer of the substrate layer;

whereby the integrated circuit device and the plurality of passive components are electrically interconnected in a vertical fashion, occupying an area substantially the same as the integrated circuit device.

4. The apparatus of claim 1, further comprising:

a main substrate board for electrically and mechanically mounting the first conductive layer of the substrate layer thereon; and an integrated circuit device electrically and mechanically mounted onto the second conductive layer of the substrate layer;

whereby the integrated circuit device and the plurality of passive components are electrically connected to the main substrate board in a vertical fashion, occupying an area on the main substrate board substantially the same as the integrated circuit device.

5. The apparatus of claim 1, wherein the passive components comprise resistors.

6. The apparatus of claim 1, wherein the passive components comprise capacitors.

7. The apparatus of claim 1, wherein the passive components comprise inductors.

8. The apparatus of claim 1, wherein the passive components comprise resistors and capacitors.

9. The apparatus of claim 1, wherein the substrate layer is a thick-film substrate.

10. The apparatus of claim 1, wherein the substrate layer is a co-fired ceramic material.

11. The apparatus of claim 3, wherein:

the integrated circuit device includes a plurality of input/output contact pads positioned proximal to the contact pads on the substrate layer to permit interconnection therebetween.

12. The apparatus of claim 3, wherein the dielectric layer and the second conductive layer each have an outside boundary that is interior to an outside boundary of the substrate layer such that an edge of the substrate layer is exposed.

13. A three-dimensional microelectronic integrated circuit package comprising:

an integrated circuit including a bottom surface having a first periphery;

a component assembly formed with passive-circuit components and having a mounting surface for mounting the bottom surface of the integrated circuit thereon, the mounting surface having a second periphery sized such that the first periphery of the integrated circuit is substantially contiguous with the second periphery, the component assembly comprising:

a ceramic substrate having the passive-circuit components printed on a first planar surface of the substrate, the passive components having connection terminals extending to an edge of the first planar surface for establishing electrical communication with the integrated circuit;

a layer of dielectric material placed over the passive components such that the connection terminals are exposed;

conductive means, placed over the layer of dielectric material, for providing the mounting surface for the integrated circuit device, the conductive means further including means for electrically connecting the bottom surface of the integrated circuit with a bottom surface of the component assembly.

14. The integrated circuit package of claim 13, wherein the edge comprises a side surface of the substrate.

15. The integrated circuit package of claim 13, wherein the conductive means comprises:

a first ground plane mounted on the bottom surface of the substrate;

a second ground plane mounted on a top surface of the substrate; and a conductor between the first ground plane and the second ground plane.

16. The integrated circuit package of claim 13, wherein the passive circuit components are resistors.

17. The integrated circuit package of claim 13, wherein the substrate is a thick-film substrate.

18. The integrated circuit package of claim 13, wherein the substrate is a co-fired ceramic material.

19. The integrated circuit package of claim 15, wherein the conductor between the first and second ground planes are electrically connected through a conductive via formed in the substrate and the dielectric material.

20. A three-dimensional electronic package combining an integrated circuit with passive electronic components for incorporation into a main substrate board of a cardiac stimulation device comprising:

a substrate layer having a plurality of passive circuit components formed on a first surface of the substrate layer, the passive components having electrical fingers extending to an edge of the substrate layer;

a first metallic pad defining a first outer boundary, the first metallic pad being printed on the second surface of the substrate layer with the first outer boundary substantially within the confines of the substrate layer;

a dielectric layer printed on the first surface of the substrate layer for insulating the passive components, the dielectric layer defining a second outer boundary smaller than the first outer boundary to expose the electrical fingers;

a second metallic pad printed on the dielectric layer and substantially within the second outer boundary, the second metallic pad in electrical communication with the first metallic pad; and an integrated circuit mounted on the second metallic pad and substantially within the second outer boundary, the integrated circuit having electrical contact pads proximate the electrical fingers enabling interconnection between the contact pads and the fingers.

21. The apparatus of claim 20, wherein the main substrate board includes means for electrically and mechanically mounting the first metallic pad of the substrate layer thereon, the main substrate board having a plurality of wirebond pads thereon, further comprising:

a first set of wirebonds between the integrated circuit and the plurality of wirebond pads on the main substrate board;

a second set of wirebonds between the electrical fingers on the substrate layer and the plurality of wirebond pads on the main substrate board;

whereby the integrated circuit and the substrate layer are electrically connected to the main substrate board in a vertical fashion, occupying an area substantially the same as the integrated circuit.

* * * * *